United States Patent [19]

Uchida et al.

[11] Patent Number: 5,200,348

[45] Date of Patent: * Apr. 6, 1993

[54] METHOD OF MANUFACTURING SEMICONDUCTOR DEVICE WITH CONSTANT WIDTH DEEP GROOVE ISOLATION

[75] Inventors: Akihisa Uchida; Daisuke Okada; Toshihiko Takakura, all of Koganei; Katsumi Ogiue, Nishitama; Yoichi Tamaki, Kokubunji; Masao Kawamura, Fuchu, all of Japan

[73] Assignee: Hatachi, Ltd., Tokyo, Japan

[*] Notice: The portion of the term of this patent subsequent to Aug. 1, 2006 has been disclaimed.

[21] Appl. No.: 801,865

[22] Filed: Dec. 3, 1991

Related U.S. Application Data

[60] Continuation of Ser. No. 353,060, May 17, 1989, Pat. No. 5,084,402, which is a division of Ser. No. 169,748, Mar. 18, 1988, Pat. No. 4,853,343, which is a division of Ser. No. 946,778, Dec. 26, 1986, Pat. No. 4,746,963, which is a continuation of Ser. No. 529,132, Sep. 2, 1983, abandoned.

[30] Foreign Application Priority Data

Sep. 6, 1982 [JP] Japan ................. 57-153910

[51] Int. Cl.⁵ ............... H01L 21/306; H01L 21/76
[52] U.S. Cl. ............................. 437/33; 437/67; 437/69
[58] Field of Search ............... 437/33, 61, 67, 69

[56] References Cited

U.S. PATENT DOCUMENTS 4,542,579  9/1985  Poponiak et al. ............. 437/67
4,853,343  8/1989  Uchida et al. ............. 437/33

Primary Examiner—Olik Chaudhuri
Assistant Examiner—Ourmazd S. Ojan
Attorney, Agent, or Firm—Antonelli, Terry, Stout & Kraus

[57] ABSTRACT

A semiconductor device employing a new isolation process is disclosed, wherein an isolation area is a region in which a burying material is buried in a deep groove formed in a semiconductor body with a substantially constant width by anisotropic dry etching, semiconductor elements are formed in selected ones of semiconductor regions isolated by the isolation area, and others of the semiconductor regions, with no semiconductor element formed therein, have their whole surface covered with a thick oxide film which is produced by the local oxidation of the semiconductor body.

The new isolation process is well-suited for a bipolar type semiconductor device, wherein the deep groove is formed so as to reach a semiconductor substrate through an N+-type buried layer, and a thick oxide film formed simultaneously with the aforementioned thick oxide film isolates the base region and collector contact region of a bipolar transistor.

16 Claims, 2 Drawing Sheets

METHOD OF MANUFACTURING SEMICONDUCTOR DEVICE WITH CONSTANT WIDTH DEEP GROOVE ISOLATION

This application is a continuation application of application Ser. No. 07/353,060, filed May 17, 1989, now U.S. Pat. No. 5,084,402, which is a divisional application of application Ser. No. 169,748, filed Mar. 18, 1988, now U.S. Pat. No. 4,853,343, which is a divisional application of application Ser. No. 946,778, filed Dec. 26, 1986, now U.S. Pat. No. 4,246,963, which is a continuation application of application Ser. No. 529,132, filed Sep. 2, 1983, now abandoned.

BACKGROUND OF THE INVENTION

This invention relates to a semiconductor integrated circuit device (hereinbelow termed "IC") having a high density of integration and a method of manufacturing it.

New isolation techniques suited to render ICs high in the density of integration are being developed in large numbers. Many of them utilize the (isotropic) reactive ion etching in which side etching is scarcely involved (refer to "NIKKEI ELECTRONICS", Mar. 29, 1982, pp. 90–101).

Such isolation technique itself is applicable to no only bipolar ICs, but also MOSICs. It can have its merits exploited, especially in the bipolar ICs which require deep isolation regions. In the following, therefore, description will be centered on the bipolar ICs, but is not limited thereto.

As one of the isolation techniques of the specified type, there is a method in which the part of a semiconductor body to become an isolation region is cut to form a groove, whereupon the groove is filled up by employing an insulating material, such as $SiO_2$, or polycrystalline silicon, as a burying material. A concrete expedient for filling up the groove part with the burying material is as stated below. On the whole surface of the semiconductor body formed with the groove, the burying material is deposited to be thick. Subsequently, the whole surface is etched and flattened, thereby to remove the excessive burying material.

In an IC, in laying out various elements such as transistors, a large isolation region for forming wiring is inevitably set in a selected part of a chip, particularly the peripheral part thereof. This poses the problem of the flattening of the surface of that part. The isolation region part which is narrow compared to its depth is not very serious because the groove is almost filled up. In contrast, regarding the isolation part which is wide compared to its depth, unavoidably a large hollow develops on the surface even after the deposition of the burying material. A process which is necessary for further flattening such surface is considerably complicated. Therefore, a process for forming the whole device becomes complicated and forms a serious difficulty in the aspect of production.

As a measure for solving such difficulty in the aspect of production the inventors studied a method in which the width of the aforementioned groove is set at a substantially constant small value within a range of, e.g., about 1.0–2.5 μm, in relation to the resolving power of photolithography, etc. The reason that this solves such difficulty is that, with the CVD (Chemical Vapor Deposition) for depositing the burying material, the narrow groove is readily filled up because the burying material is piled up also from the side surfaces of the groove.

On the other hand, however, in the case where the width of the groove for electric isolation is rendered constant, e.g., at a substantially small value, wiring must be formed on the inactive area of a semiconductor body (the area where no semi-conductor element is formed). The inactive area is not covered thereon with a thick insulating film as obtained by the use of the isoplanar technique. With such wiring structure, accordingly, the wiring capacitance between the wiring and the semiconductor body becomes large, resulting in the problem that the electric characteristics of the device worsen, namely, that the signal propagation is delayed.

SUMMARY OF THE INVENTION

An object of the present invention is to solve, in producing an IC by applying the isolation technique described before, the difficulty in the aspect of manufacture and also the problem with respect to the electric characteristics of the device.

According to the most desirable embodiment of the present invention, an isolation region for electrically isolating the major surface of a semiconductor body into a plurality of semiconductor areas is such a region that a burying material, e.g., an insulator, fills up a deep groove which is formed in the semiconductor body and which has a substantially constant width. In selected ones of the semiconductor areas, semiconductor elements are formed. On the inactive area where no semiconductor element is formed, a thick oxide film is formed. The thick oxide film is formed by the local oxidation of the semi-conductor body. Wiring can be provided on the thick oxide film. Since the width of the groove is constant over the entire semiconductor body, the step of filling up the groove with the burying material is simple. Moreover, the capacitance which wiring, extending directly on the inactive area, possesses between it and the semiconductor body is reduced by utilizing the thick oxide film.

DESCRIPTION OF PREFERRED EMBODIMENTS

Now, the contents of this invention will be expounded with reference to the accompanying drawings.

Figure 1:
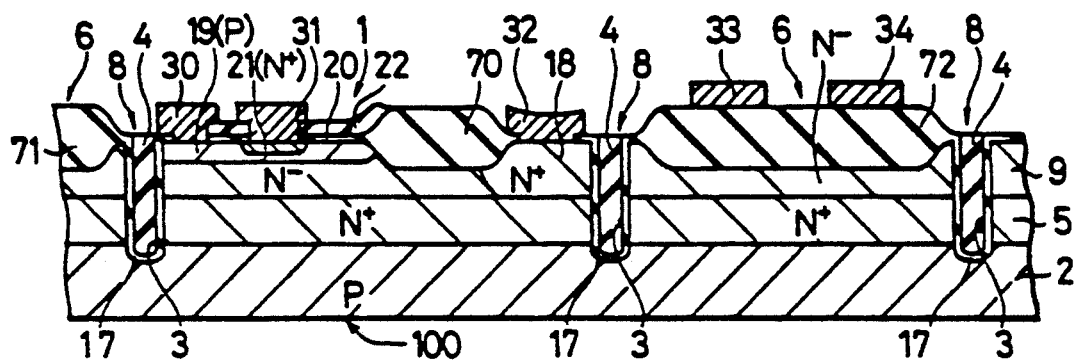
FIG. 1 is a sectional view of a bipolar IC showing an embodiment of this invention.

FIG. 1 is a sectional view showing an embodiment in which this invention is applied to a bipolar IC.

Various constituents in the bipolar IC will be clarified from the description on a manufacturing method later. Therefore, this invention will be outlined here.

A semiconductor body 100 has an N+-type buried layer 5 and further an N−-type epitaxial layer 9 on a P-type silicon semiconductor substrate 2. A bipolar transistor is formed in an active area 1 where the element is to be formed, that is, a selected one of semiconductor areas which are electrically isolated by a groove 3 forming an isolation area. The active area includes a P-type base region 19, an N+-type emitter region 21 and an N+-type collector contact region 18; this bipolar transistor includes an N-type collector region composed of the epitaxial layer, the buried layer and the collector contact region. An electrode 30 of aluminum is held in ohmic contact with the base region 19. Likewise, an aluminum electrode 31 is held in ohmic contact with the emitter region 21, and an aluminum electrode 32 with the collector contact region 18. These electrodes are brought into contact through contact holes which are provided in a thin oxide film 20 (several tens nm), formed by the thermal oxidation of the surface of the semiconductor body 100, and a passivation film 22. The passivation film 22 can be of, e.g., phosphosilicate glass (PSG), with a thickness of, e.g., 300-350 nm, or $Si_3N_4$, of a thickness of, e.g., 50-140 nm.

As will be stated later, wiring layers 33 and 34 of aluminum are formed on a thick silicon oxide film 72 in an inactive area 6, namely, the area where no semiconductor element is formed among the semiconductor areas electrically isolated by the isolation area or groove 3.

In accordance with this invention, the deep groove 3 whose width is set substantially constant (for example, 1.0-1.5 μm, but such width is not limited thereto) is formed in one surface of the semiconductor body 100 and over the whole area thereof, and the groove 3 is filled up with a burying material 4, which can be an insulating material such as $SiO_2$. Moreover, the burying material can be an organic insulator, such as a polyimide. Thus, the electrical isolation among the elements is effected. The burying material may well be material other than an insulator, for example, polycrystalline silicon. In this case, the surface of the polycrystalline silicon filling up the groove needs to be oxidized. The isolation area defines a plurality of element forming areas. In case of the bipolar IC, the deep groove 3 needs, at least, to be deep enough to reach the semiconductor substrate 2 through the buried layer 5, and its depth dimension is greater than its width dimension. As an example, in a bipolar IC having buried layer 5 with a thickness of 1,000-2,000 nm and epitaxial layer 9 with a thickness of 800-2000 nm, the depth of groove 3 is, e.g., 2000-5000 nm. In case of an MOSIC, however, the groove can be shallowed within a range which the electrical isolation among the elements is possible. As an illustration thereof, in a CMOSIC, the depth of the groove is 2000-3000 nm for preventing latch up. Accordingly, the expression "deep" in the deep groove 3 signifies that the groove has a depth sufficient for electrically isolating the elements.

In addition, in this invention, thick oxide films 71 and 72 are formed by the local oxidation of the surface of the semiconductor body 100 over the whole surface parts of the areas (inactive areas) 6 where the semiconductor elements, such as transistors, are not formed. These thick oxide films can be formed by, e.g., the conventional isoplanar technique. The thick oxide films 71 and 72 serve to reduce the stray capacitances of the aluminum wiring leads 33 and 34 to be formed thereon. They accordingly need, at least, be thick enough to lower the stray capacitances of the wiring leads. The thicknesses of the oxide 71 and 72 are selected within a range of from 400-2000 nm. This value is considerably greater than the thickness of the thermal oxidation film 20 of the surface of the semiconductor body in the area where the semiconductor element is formed.

In the above embodiment, numeral 17 indicates a thin silicon oxide film which is formed in the groove portion. The silicon oxide film 17 is provided in order to protect the surface of the semiconductor body exposed in the groove 3 against contamination, e.g., in later steps. In the case of employing any other material than the insulator as the burying material, the silicon oxide film 17 is indispensable and it is rendered as thick as several hundred nm. Shown at numeral 70 is a thick silicon oxide film which serves to isolate the collector contact region 18 and the base region 19, and which is formed simultaneously with the other thick silicon oxide films 71 and 72.

The thick oxide films 71 and 72 adjoin the isolation area 8 among the elements to form the deep groove 3. Therefore, the thick oxide films 71 and 72 can be utilized as a mask at the step of forming the deep groove 3. From this viewpoint, it is favorable to form the thick oxide films 70, 71 and 72 by the local oxidation and thereafter form the deep groove 3.

In order to isolate the collector contact region 18 from the base region 19 by employing an insulator instead of the thick oxide film 70, a groove shallower than the groove 3 can also be used. The depth of this groove can be, e.g., a little deeper than epitaxial layer 9 (e.g., 800-2000 nm). The same burying materials used for groove 3 can be used for this shallower groove. In the present embodiment, however, the thick oxide film 70 is used for preventing the deterioration of the electrical characteristics of the transistor. This technique has been finished up on the basis of the inventors' experiment on the isolation technique. The inventors' study has revealed that, when the oxide film 70 is replaced with the groove shallower than the groove 3, defects concerning the characteristics of the element are liable to arise in the vicinity of the shallower groove. They are attributed to crystal defects caused by dislocations, and are difficult to avoid in devices of the structure isolating the collector contact region and the base region by the use of the shallower groove. In regard to the function of the isolation, the isolation are 8 and the shallower groove for isolating the collector contact region join each other at both ends of the shallower groove, so that steps of the grooves develop in those parts.

Since, in this embodiment, the collector contact region 18 is isolated by the oxide 70 produced by the local oxidation of the surface of the semiconductor body 100, steps of the grooves are not involved, and the crystal defects due to the dislocations do not appear, either. Moreover, defects having originally existed can be caused to disappear by performing the local oxidation at a higher temperature of, e.g., about 1100° C.

In the next place, there will be explained a manufacturing method which is well-suited for producing the bipolar IC shown in FIG. 1.

Figure 2A:
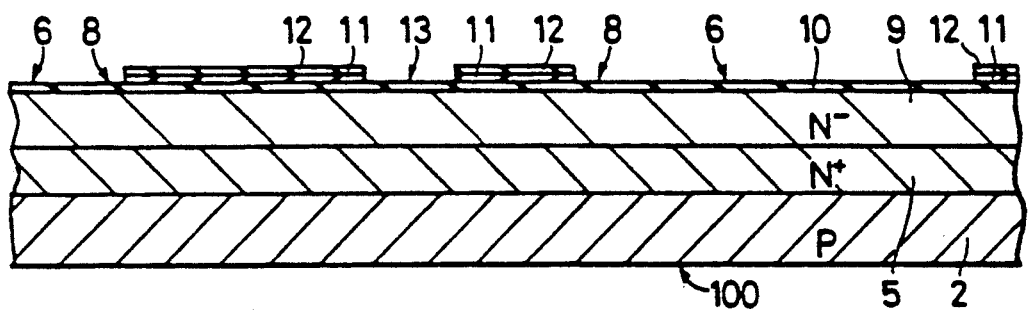
FIGS. 2A–2F are processing step diagrams showing a method of manufacturing the bipolar IC shown in FIG. 1.

First, an N+-type buried layer 5 which is 1-2 μm thick is disposed on the major surface of a P-type Si substrate 2 having the crystal face (100), and an N−-type Si epitaxial layer (1-2 μm thick, more desirably 1.4-1.6 μm thick) 9 to become the active parts of a transistor is formed thereon. The buried layer 5 can be formed by, e.g., conventional procedures. Thus, a semiconductor body 100 is obtained. Subsequently, the surface of the Si epitaxial layer 9 is thermally oxidized to form an $SiO_2$ film (silicon oxide film) 10 which is about 500-900 Å thick. On the $SiO_2$ film 10, an oxidation impermeable film, e.g., $Si_3N_4$ film 11 (having a thickness of, for example, 50-140 nm) is deposited by the conventional CVD method, and further an $SiO_2$ (or phosphosilicate glass) film 12 is deposited by the low pressure CVD in succession. The thickness of film 12 is determined by the depth of grooves 3 and etching rate ratio of the material of film 12 (e.g., SiO$_2$) and Si and, as an example, can be 100–300 nm. Thereafter, as shown in FIG. 2A, the SiO$_2$ film 12 and the Si$_3$N$_4$ film 11 are patterned by conventional photolithography, to open parts which are to become an isolation area 8 among elements and an inactive area 6, together with a collector contact isolation portion 13.

Figure 2B:
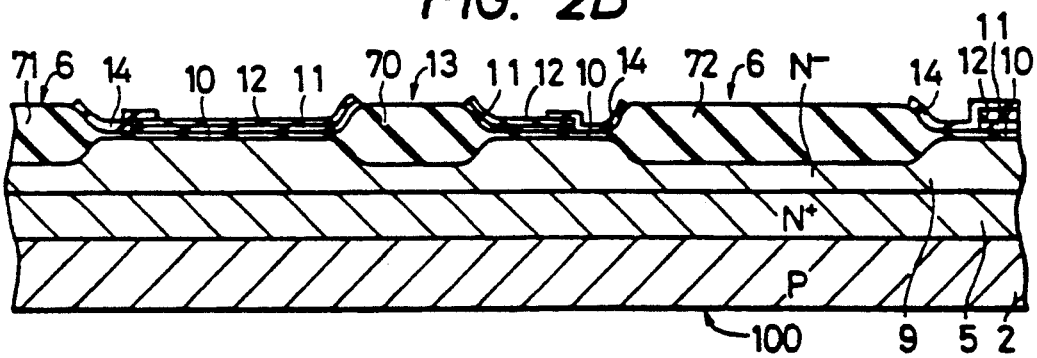
Figure 3:
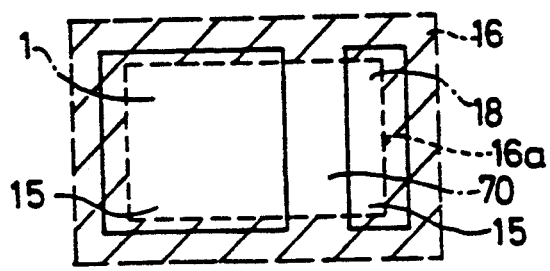
FIG. 3 is a diagram showing an example of a mask pattern for use in the manufacture of a device.

Next, selected parts of the opened isolation area 8 among the elements are covered with an Si$_3$N$_4$ film (silicon nitride film) 14. As shown in FIG. 2B, using the Si$_3$N$_4$ film 14 and the opened Si$_3$N$_4$ film 11 as a mask, the surface of the Si body 100 is locally oxidized, whereby thick oxide films 70, 71 and 72 each having a thickness of about 1 μm are formed in the respective parts of the collector contact isolation portion 13 and the inactive areas 6. An example of the essential portions of the mask patterns for use in these steps is shown in FIG. 3. Regarding the positioning between a mask pattern 15 for forming the pattern of the SiO$_2$ film 12 as well as the Si$_3$N$_4$ film 11 and a mask pattern 16 for etching the Si$_3$N$_4$ film 14, the inner peripheral edge 16$a$ of the mask pattern 16 may be arranged so as to overlie the mask pattern 15, and the positioning is easy. Thus, the width of a groove 3 to be formed later becomes slightly greater at both the ends of the oxide film 70. However, the change of the groove width to such extent does not form an obstacle to a filling operation.

Figure 2C:
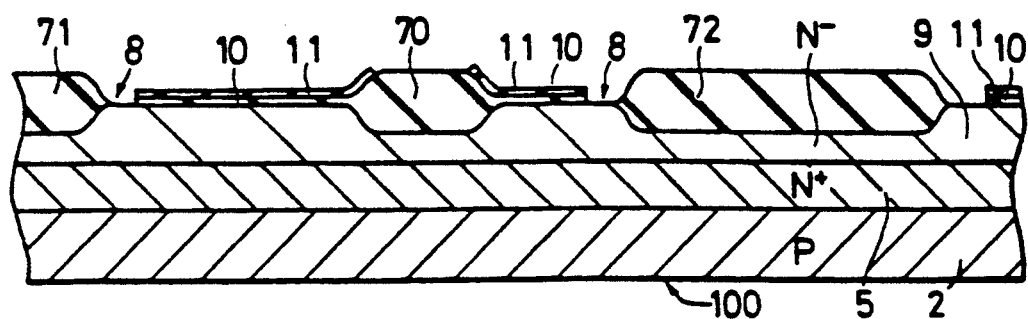

After the local oxidation has been ended in this way, the Si$_3$N$_4$ film 14 is used as the mask for the local oxidation is removed, and the underlying SiO$_2$ film 10 is partly removed. As to the Si$_3$N$_4$ film 14, either dry etching, or wet etching with hot phosphoric acid, may be employed. As to the underlying SiO$_2$ film 10, the use of dry etching is recommended. The reason is that since the thick oxide films 70, 71 and 72 are utilized as a mask in the etching of the SiO$_2$ film 10, the overetching of them should be avoided. Basically, neither of the etching steps of the Si$_3$N$_4$ film 14 and the SiO$_2$ film 10 requires any new mask. Owing to the series of etching processing, Si in the part of the Si body 100 corresponding to the isolation area 8 among the elements is exposed as shown in FIG. 2C. If thereafter the thick oxide films to serve as a mask for forming the groove are etched over the whole surface, then the groove width can be set great at will. That is, thin parts (bird's beak parts) at the ends of the thick oxide films are etched to expose the Si body more.

Figure 2D:
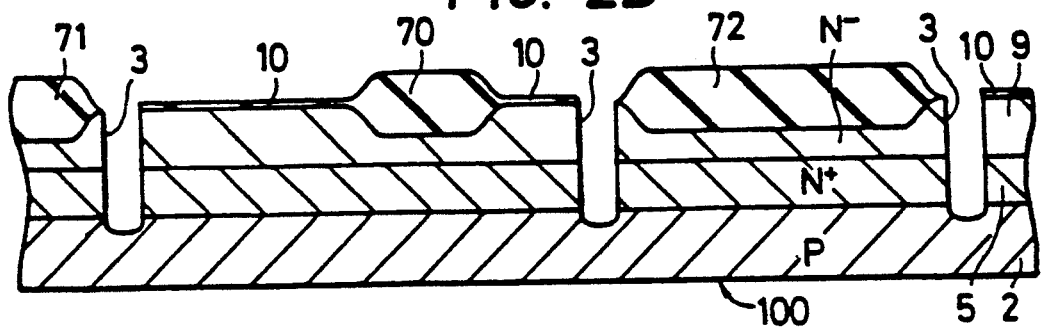

Next, the deep groove 3 is formed as shown in FIG. 2D. The deep groove 3 needs to have a depth at which it reaches the semiconductor substrate 2 by penetrating the buried layer 5. In forming the deep groove 3, accordingly, reactive ion etching in which side etching is scarcely involved is used. Conventional procedures for such reactive ion etching can be used. As a gas, it is preferable to use CCl$_4$-gas to which O$_2$-gas (e.g., 30% by volume O$_2$) is added. The capability of masking the etching action of the reactive ion etching becomes higher in the order of Si, Si$_3$N$_4$ and SiO$_2$. Si$_3$N$_4$ can be rendered about 10 times higher than Si in the capability, and SiO$_2$ about 20 times higher than Si. Accordingly, the deep groove 3 can be formed by utilizing such differences of the etching resistance. In forming such deep groove 3, an obliquely etched surface may be formed in an upper part by anisotropic etching with an alkaline etchant such as hydrazine or potassium hydroxide KOH before the reactive ion etching. Alternatively, after the reactive ion etching, etching with fluoric or nitric acid may be added in order to shape an exposed surface. At the time of the completion of the etching for the deep groove 3, the Si$_3$N$_4$ film 11 as the mask can be removed almost entirely. Of course, the Si$_3$N$_4$ film 11 can be left behind depending on the selection ratio of the ion etching, the thickness of the Si$_3$N$_4$ film and the depth of the etching groove.

Figure 2E:
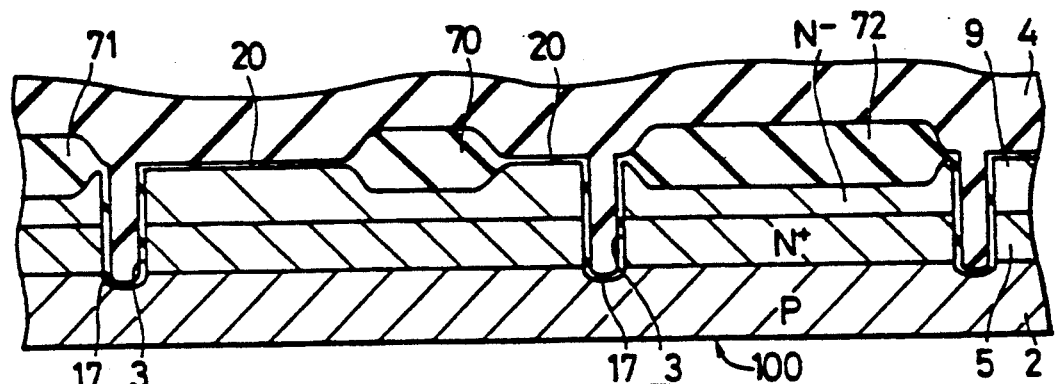

Subsequently, a silicon oxide film (SiO$_2$ film) 17 having a thickness of 250–4000 Å is formed on the exposed inner surface of the deep groove 3 by, e.g., conventional thermal oxidation. At the same time, or after the formation of the oxide film 17, the major surface of the semiconductor body 100 is covered with a silicon oxide film 20 being 500–900 Å thick anew by the thermal oxidation thereof. In forming the oxide film 20, the oxide film 10 needs to be removed in advance. Although the oxide film 10 can also be replaced with the oxide film 20, it is better to form the oxide film 20 anew. Thereafter, a burying material 4 which is an insulating material such as SiO$_2$ is deposited on the whole surface of the Si substrate 2 by the CVD process as shown in FIG. 2E. The amount of deposition needs, at least, to exceed the depth of the groove 3.

Figure 2F:
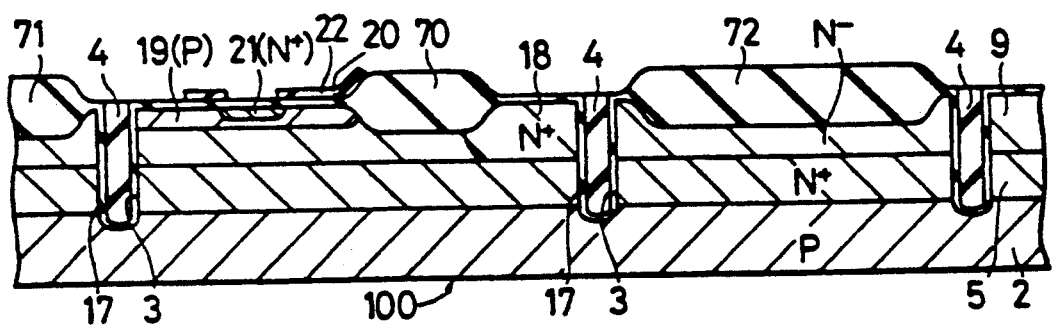

At the next step, the deposited burying material 4 is removed by such isotropic etching as, e.g., conventional plasma etching, to flatten the major surface of the Si body 100 as shown in FIG. 2F. Thus, the isolation steps are completed. Since, in this case, the width of the deep groove 3 is rendered constant over the whole area of the Si$_3$N$_4$ body 100, the surface of the burying material 4 as deposited is substantially flat, and the surface flattening mentioned above is sharply simplified. It is sometimes recommended that the deposited burying material 4 is coated with a photoresist or SOG (Spin-On-Glass), whereupon the surface is flattened by isotropic etching resorting to physical means (e.g., conventional plasma etching). The photoresist or SOG is preferably used when the groove width is greater than 3000 nm. Examplary thicknesses for the photoresist and SOG film are 1000 nm and 200–300 nm, respectively. Thus, the flattening of the surface can be executed more effectively. In a case where any material other than the insulator is employed as the burying material, its surface needs to be covered with an insulator. For example, in case of employing polycrystalline silicon, the surface is flattened and it is covered with an SiO$_2$ film by, e.g., conventional thermal oxidation thereof.

After the isolation steps, the N$^+$-type collector contact portion 18 and the P-type base region 19 are formed in the epitaxial layer 9 as shown in FIG. 2F, e.g., by conventional processing steps. The collector contact portion 18 is formed by employing the oxide film 70 and the isolation area 8 as a mask, and in self-alignment thereto. The base region 19 is similarly formed. In forming the two regions, the registration margin of photoresist masks is unnecessary. A passivation film 22 such as silicon oxide film is formed on the surface and is patterned, and an N$^+$-type emitter region 21 is formed. Thereafter, as shown in FIG. 1, aluminum electrodes 30, 31 and 32 are disposed through contact holes formed in the thin thermal oxidation film 20 and the passivation film 22, and wiring leads 33 and 34 are disposed. Then the bipolar IC is finished up.

In this manner, in the foregoing bipolar IC, the collector contact isolation portion 13 is disposed at the boundary between the collector contact portion 18 and the base region 19, and hence, the breakdown voltage between the base and collector of the transistor can be enhanced sufficiently. In this case, in the illustrated example, the collector contact isolation portion 13 is formed of the oxide film 70 produced by the local oxidation of the major surface itself of the Si body 100. Therefore, the oxide film 70 itself can be formed simultaneously with the thick oxide films 71 and 72 for reducing the capacitance coupled to the wiring.

The collector contact isolation portion 13, however, can also be constructed so as to fill up a groove with a burying material similarly to the isolation area 8 among the elements.

This invention is greatly effective when applied to a bipolar IC, especially a bipolar memory such as a PROM or RAM. It is also applicable to a MOSIC etc. In the application to the MOSIC, a P-type or N-type semiconductor body can be used for forming MOSFETs or for forming a complementary MOSIC (CMOSIC). In the CMOSIC, it is also possible to isolate the MOSFETs by thick oxide films and the well regions (of the P-type and N-type) by a deep groove.

As set forth above, according to this invention, the width dimension of the deep groove 3 in the isolation area 8 among elements is rendered substantially constant over the whole semiconductor body 100, and hence, a process for flattening the surface of the burying material 4 can be sharply simplified. Moreover since the thick oxide films 71 and 72 produced by the local oxidation of the body itself of the semiconductor body 100 is formed in the surface part of the inactive area 6 where no semiconductor element is formed, there can be attained the excellent effect that the wiring capacitance between the substrate 2 and the wiring lead running on the inactive area 6 can be reduced.

With the manufacturing method in which the thick oxide films 70, 71 and 72 are first formed by the local oxidation techniq 1e and the deep groove 3 is thereafter formed using these thick oxide films 70, 71 and 72 as a part of a mask, a great effect can be attained in the aspect of production concerning the mask registration, etc.

What is claimed is:

1. A method of manufacturing a semiconductor device, comprising the steps of:
   (a) selectively forming an oxidation impermeable mask on a main surface of a semiconductor body, said semiconductor body including a semiconductor substrate of a first conductivity type, a buried semiconductor layer of a second conductivity type opposite to said first conductivity type on said substrate, and an epitaxial semiconductor layer, said main surface corresponding to an upper surface of said epitaxial semiconductor layer, said mask covering a first region of said main surface in which a semiconductor element having a PN junction is to be formed;
   (b) oxidizing a second region of said main surface exposed from said oxidation impermeable mask by employing said oxidation impermeable mask, thereby to selectively form a thick oxide film in said second region;
   (c) after the step (b), forming a groove in said main surface of said semiconductor body so as to surround said first region, wherein said groove reaches said semiconductor substrate of said first conductivity type through said buried semiconductor layer;
   (d) forming a thin oxide film within said groove so as to cover a whole exposed surface of said groove, said thin oxide film being thinner than that of said thick oxide film;
   (e) filling said groove with a material so as to form an isolation structure; and
   (f) introducing impurities of said first conductivity type into said fist region, to form a first semiconductor layer of said first conductivity type in said first region, wherein said first semiconductor layer and said epitaxial semiconductor layer in said first region form said PN junction of said semiconductor element.

2. A method according to claim 1 including the further step, prior to step (a), of providing said semiconductor body including said semiconductor substrate, said buried semiconductor layer an said epitaxial semiconductor layer.

3. A method according to claim 1, wherein said material which fills said groove is polycrystalline silicon, and wherein said groove is filled with said polycrystalline silicon such that said polycrystalline silicon does not contact said whole exposed surface of said groove.

4. A method according to claim 1, wherein said groove has a constant width over the entire semiconductor body.

5. A method according to claim 1, wherein the step (d) of forming said thin oxide film includes a step of oxidizing said whole exposed surface of said groove.

6. A method according to claim 1, wherein said semiconductor element comprises a bipolar transistor, and wherein said PN junction is a base-collector junction of said bipolar transistor.

7. A method of manufacturing a semiconductor device, comprising the steps of:
   (a) forming a first thin oxide film on a main surface of a semiconductor body, the semiconductor body including a semiconductor substrate of a first conductivity type, a buried semiconductor layer of a second conductivity type opposite to said first conductivity type on said substrate, and an epitaxial semiconductor layer of said second conductivity type on said buried semiconductor layer, the main surface corresponding to an upper surface of said epitaxial semiconductor layer;
   (b) selectively forming an oxidation impermeable mask on said first thin oxide film on said main surface of said semiconductor body, said mask covering a plurality of first regions of said main surface in which semiconductor elements each having a PN junction are to be respectively formed;
   (c) oxidizing a second region of said main surface exposed from said oxidation impermeable mask by employing said oxidation impermeable mask, thereby to selectively form a thick oxide film in said second region, said thick oxide film being thicker than said first thin oxide film;
   (d) after the step (c), forming a groove in said main surface of said semiconductor body so as to surround each of said plurality of fist regions, wherein said groove reaches said semiconductor substrate of semi first conductivity type through said buried semiconductor layer;
   (e) forming a second thin oxide film within said groove so as to cover a whole exposed surface of said groove, said second thin oxide film being thinner than that of said thick oxide film;
   (f) filling said groove with a material so as to form an isolation structure;

(g) introducing impurities of said first conductivity type into each of said plurality of firs regions, to form a first semiconductor layer of said first conductivity type in each of said plurality of first regions, wherein said first semiconductor layer and said epitaxial semiconductor layer in each of said plurality of firs regions form said PN junction of each of said semiconductor elements; and (h) forming wiring layers on said thick oxide film in said second region, said wiring layers being used for interconnecting between said semiconductor elements.

8. A method according to claim 7, including the further step prior to step (a), of providing said semiconductor body including said semiconductor substrate, said buried semiconductor layer and said epitaxial semiconductor layer.

9. A method according to claim 7, wherein said material is polycrystalline silicon, and wherein said groove is filled with said polycrystalline silicon such that said polycrystalline silicon does not contact said whole exposed surface of said groove.

10. A method according to claim 7, wherein said groove has a constant width over the entire semiconductor body.

11. A method according to claim 7, wherein the step (e) of forming said second thin oxide film includes a step of oxidizing said whole exposed surface of said groove.

12. A method according to claim 7, wherein each of said semiconductor elements comprises a bipolar transistor, and wherein said PN junction of each of said semiconductor elements is a base-collector junction of said bipolar transistor.

13. A method of manufacturing a semiconductor device having bipolar transistors, comprising the steps of:

(a) forming a first thin oxide film on a main surface of a semiconductor body, the semiconductor body including a semiconductor substrate of a first conductivity type, a buried semiconductor layer of a second conductivity type opposite to said first conductivity type on said substrate, and an epitaxial semiconductor layer of said second conductivity type on said buried semiconductor layer, said main surface corresponding to an upper surface of said epitaxial semiconductor layer;

(b) selectively forming an oxidation impermeable mask on said first thin oxide film on said main surface of said semiconductor body, said mask covering a plurality of fist regions of said main surface in which said bipolar transistors are to be respectively formed;

(c) oxidizing a second region of said main surface exposed from said oxidation impermeable mask by employing said oxidation impermeable mask, thereby to selectively form a thick oxide film in said second region, said thick oxide film being thicker than said first thin oxide film;

(d) after the step (c), forming a groove in said main surface of said semiconductor body so as to surround each of said plurality of fist regions, wherein said groove reaches said semiconductor substrate of said first conductivity type through said buried semiconductor layer, wherein a collector region of each of said bipolar transistor comprises said buried semiconductor layer and said epitaxial semiconductor layer of each of said plurality of first regions surrounded by said groove;

(e) forming a second thin oxide film within said form so as to cover a whole exposed surface of said groove, said second thin oxide film being thinner than that of said thick oxide film;

(f) filling said groove with a material so as to form an isolation structure;

(g) introducing first impurities of said firs conductivity type into said epitaxial semiconductor layer of said collector region of each of said bipolar transistors, to form a first semiconductor layer of said first conductivity group used as a base region of each of said bipolar transistor;

(h) introducing second impurities of said second conductivity type into said first semiconductor layer used as said base region, to form a second semiconductor layer of said second conductivity type used as an emitter region of each of said bipolar transistors; and (i) forming wiring layers on said thick oxide film in said second region, said wiring layers being used for interconnecting between said bipolar transistors.

14. A method according to claim 13, including the further step, prior to step (a), of providing said semiconductor body including said semiconductor substrate, said buried semiconductor layer and said epitaxial semiconductor layer.

15. A method according to claim 13, wherein said material is polycrystalline silicon, and wherein said groove is filled with said polycrystalline silicon such that said polycrystalline silicon does not contact said whole exposed surface of said groove.

16. A method according to claim 13, wherein said groove has a constant width over the entire semiconductor body.

* * * * *